(12) United States Patent
Towata

(10) Patent No.: US 6,630,287 B2
(45) Date of Patent: Oct. 7, 2003

(54) METHOD FOR FORMING THICK FILM PATTERN AND PHOTOSENSITIVE PASTE USED THEREFOR

(75) Inventor: Shuichi Towata, Moriyama (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 40 days.

(21) Appl. No.: 09/897,305

(22) Filed: Jul. 2, 2001

(65) Prior Publication Data

US 2002/0076657 A1 Jun. 20, 2002

(30) Foreign Application Priority Data

Jun. 30, 2000 (JP) ........................................ 2000-198070
May 11, 2001 (JP) ........................................ 2001-142092

(51) Int. Cl.$^7$ ................................................. G03C 5/00
(52) U.S. Cl. ...................... 430/311; 430/17; 430/270.1; 430/322
(58) Field of Search ......................... 430/311, 17, 270.1, 430/322

(56) References Cited

U.S. PATENT DOCUMENTS 5,173,457 A * 12/1992 Shorthouse .................. 501/65

* cited by examiner

Primary Examiner—Christopher G. Young
(74) Attorney, Agent, or Firm—Dickstein, Shapiro, Morin & Oshinsky, LLP.

(57) ABSTRACT

A method for forming a thick film pattern is provided which can easily perform pattern formation even when a photosensitive paste containing a powdered conductor at a high content and having a low optical transmittance is used and which can form a thick film pattern having a rectangular cross-section and superior high-frequency transmission characteristics. In addition, a photosensitive paste used therefor is also provided. The thick film pattern having a predetermined shape can be formed by the steps of determining the photocurable depth d of a photosensitive paste; coating with the photosensitive paste in consideration of the photocurable depth d so as to form a photosensitive paste film having a predetermined thickness t; exposing the photosensitive paste film; and developing the exposed photosensitive paste film. Preferably, the coating with the photosensitive paste is performed so that the relationship between the photocurable depth d of the photosensitive paste and the thickness t of the photosensitive paste film satisfies the equation $t \leq d$.

18 Claims, 1 Drawing Sheet

METHOD FOR FORMING THICK FILM PATTERN AND PHOTOSENSITIVE PASTE USED THEREFOR

BACKGROUND OF THE INVENTION

1. Field of the Invention

The present invention relates to methods for forming thick film patterns and to photosensitive pastes used for forming thick film patterns.

2. Description of the Related Art

Concomitant with the movement toward higher integration and higher processing of high-frequency electronic apparatuses, wiring conductors constituting high-frequency circuits provided in these electronic apparatuses are increasingly required to have a finer design, a larger thickness and a rectangular cross-section.

Heretofore, a thick conductor film forming a wiring conductor on a substrate is formed by the steps of preparing a conductive paste formed of an organic binder mixed with a powdered conductor, applying the conductive paste to the substrate by screen printing so as to form a desired pattern, and firing the desired pattern in order to remove the organic binder and to sinter the conductive component in the conductive paste.

However, the pattern mask accuracy used for screen printing is not always satisfactory, and for example, it has been difficult to form a fine pattern having a line width of about 100 μm or less. Accordingly, proposed as a method for forming a fine pattern which cannot be obtained by screen printing, as disclosed in Japanese Unexamined Patent Application Publication Nos. 54-121967, 54-13591 and 59-143149, is a method of forming a fine pattern on a substrate by the steps of preparing a photosensitive paste formed of a photosensitive resin composition mixed with a powdered conductor, and applying the photosensitive paste to the substrate by a photolithographic technique so as to form the fine pattern on the substrate.

As the photosensitive resin composition for forming the photosensitive paste described above, a known photopolymerizable compound, a photo-modification compound or the like may be used, and for example, (1) a mixture of a monomer or an oligomer having reactive functional groups such as unsaturated groups and a photopolymerization initiator such as an aromatic carbonyl compound, (2) a so-called diazo resin such as a condensation product of an aromatic bis-azide and formaldehyde, (3) a mixture of an addition-polymerizable compound such as an epoxy compound and a photo-acid generator such as a diallyliodonium salt and (4) a naphthoquinone diazide compound may be used.

Among these materials described above, the mixture of the monomer having reactive functional groups such as unsaturated groups and the photopolymerization initiator such as an aromatic carbonyl compound (1) is particularly preferable.

When a conductor layer having a high electrical conductivity is formed, it is necessary to avoid defects such as wire breakage or crack generation which occurs while the conductor layer shrinks during firing, and as a result, it is necessary to increase the content of powdered conductor which is mixed with a photosensitive resin composition. However, when the content of the powdered conductor is increased, the optical transmittance of the photosensitive paste is decreased, resulting in insufficient curing in the paste, i.e., resulting in insufficient curing of the photosensitive resin composition contained in the paste. Accordingly, pattern formation becomes difficult to perform, and even when pattern formation is performed, a pattern having an inversed trapezoidial cross-section or having a so-called edge curl may be formed, significantly decreasing the transmission characteristics at a high frequency band.

The problems described above occur not only in a photosensitive paste containing a powdered conductor as a powdered inorganic material but also occur in a photosensitive paste containing a powdered insulator as a powdered inorganic material.

SUMMARY OF THE INVENTION

Accordingly, in order to solve the problems described above, an object of the present invention is to provide a method for forming a thick film pattern having superior high-frequency transmission characteristics, in which even when a photosensitive paste having a high content of a powdered conductor and thereby having a low optical transmittance is used, a desired pattern having a rectangular cross-section can be easily formed, and is to provide a photosensitive paste used for forming the thick film pattern.

Through intensive research by the inventor of the present invention in order to solve the problems described above, it was discovered that a thick film pattern having a rectangular cross-section and superior high-frequency transmission characteristics could be obtained by measuring the photocurable depth of a photosensitive paste film beforehand and subsequently determining the thickness thereof in consideration of the photocurable depth described above. After further experiments and studies were performed, the present invention was finally made.

The method for forming a thick film pattern of the present invention comprises the steps of measuring a photocurable depth d of a photosensitive paste beforehand; coating with the photosensitive paste in consideration of the photocurable depth d so as to form a photosensitive paste film having a predetermined thickness t; exposing the photosensitive paste film; and developing the exposed photosensitive paste film so as to form a thick film pattern having a predetermined shape.

Since the shape (the cross-section) of the thick film pattern to be formed can be estimated to some extent from the photocurable depth d of the photosensitive paste and the film thickness t of the photosensitive paste film, a thick film pattern having a desired cross-section can be efficiently formed by measuring the photocurable depth d of the photosensitive paste beforehand and by determining the thickness t of the photosensitive paste film in consideration of the photocurable depth d. Consequently, a thick film pattern having superior adhesiveness to an object (typically, a substrate) on which the thick film pattern is formed and having a high shape accuracy can be formed.

When the thickness of the photosensitive paste film is larger than the photocurable depth to some degree, the thickness pattern to be formed tends to have a cross-section in an inversed trapezoidial shape to some extent; when the thick film pattern to be formed is not required to have a high shape accuracy, a thickness larger than the photocurable depth to some degree may be employed as the thickness of the photosensitive paste film.

In the present invention, the photosensitive paste means a paste containing a powdered inorganic material and a photosensitive resin component, and when necessary, the photosensitive paste may contain a storage stabilizer such as a solvent or a polymerization inhibitor, an anti-oxidant, a dye, a pigment, a defoaming agent, a surfactant, or the like. The type and the composition of the photosensitive paste are not specifically limited, and as long as the advantages of the present invention can be fully obtained, photosensitive pastes having various compositions may be used.

In the present invention, the photosensitive paste film means a film in a dry state which is formed by applying the photosensitive paste to a base body, such as a ceramic substrate or a PET film, by a known technique, such as screen printing or spin coating, and by drying the photosensitive paste on the base body. The thickness of the photosensitive paste film means the thickness of the film in a dry state.

In addition, the photocurable depth d of the photosensitive paste film means the depth from the surface of the film toward the inside thereof at which the energy of radiated light such as ultraviolet light is reduced to less than the minimum energy required for curing the resin component of the film either by being consumed by curing the resin component or being attenuated due to the absorption therein while the light is passing through the paste film.

As a method for evaluating (measuring) the photocurable depth described above, the following method may be mentioned by way of example.

(1) First, the photosensitive paste film is formed on a substrate such as a glass by screen printing.

(2) Next, exposure is performed on the photosensitive paste film by applying a predetermined amount of energy of light (such as ultraviolet light).

(3) Subsequently, development is performed for the exposed photosensitive paste film by using an aqueous solution containing sodium carbonate or the like at a small concentration so as to remove noncured portions, and the thickness of the remaining cured film is then measured and is determined as the photocurable depth d.

In the measurement described above, the thickness can be measured by an optical microscope, an electron microscope, a laser microscope, or the like.

In addition, the coating with the photosensitive paste in the method for forming the thick film pattern of the present invention is preferably performed so that the relationship between the photocurable depth d of the photosensitive paste and the thickness t of the photosensitive paste film satisfies the equation $t \leq d$.

When the coating with the photosensitive paste is performed so that the equation, $t \leq d$, is satisfied, that is, when the thickness t of the photosensitive paste film is equivalent to or less than the photocurable depth d, the entire photosensitive paste film in the thickness direction thereof can be reliably cured so as not to be dissolved during development. Accordingly, a thick film pattern having a desired cross-section can be reliably formed, and hence, a thick film pattern having superior adhesiveness to an object (typically, a substrate) on which the thick film pattern is formed and having a rectangular cross-section can be efficiently formed.

In addition, when this thick film pattern is fired, the rectangular cross-section thereof is retained, and edge curl, which occurs when a thick film pattern has an inversed trapezoidal cross-section, does not occur. Consequently, formation of electrode surface pointed portions at which a current is concentrated is avoided, and hence, the current concentration can be suppressed, whereby improved transmission characteristics at a high frequency can be obtained.

When the thickness of the photosensitive paste film is larger than the photocurable depth, the degree of undercutting formed during development becomes significant, and as a result, the cross-section of the photosensitive paste film tends to have a cross-section in an inversed trapezoidial shape. When a thick film pattern to be formed does not require a high shape accuracy, the film thickness of the photosensitive paste film may be determined to be larger than the photocurable depth to some degree. However, when a thick film pattern having a rectangular cross-section and having a high shape accuracy is formed, the thickness t of the photosensitive paste film must be controlled so as not to exceed the photocurable depth d.

In the method for forming the thick film pattern according to the present invention, the photosensitive paste may comprise a powdered inorganic material having an average particle diameter m, and the coating with the photosensitive paste is preferably performed so that the thickness t of the photosensitive paste film satisfies the equation, $t \leq d+m$, in which d is the photocurable depth of the photosensitive paste.

When the content of the powdered inorganic material is increased, the probability of the presence of the powdered inorganic material on the surface of the photosensitive paste film is increased; however, when the thickness t of the photosensitive paste film satisfies the equation, $t \leq d+m$, in which m indicates the average particle diameter of the powdered inorganic material contained in the photosensitive paste film, the entire photosensitive paste film in the thickness direction thereof can be substantially cured. As a result, a thick film pattern having a desired cross-section can be reliably formed, and hence, a thick film pattern having superior adhesiveness to an object (typically, a substrate) on which the thick film pattern is formed and having a high shape accuracy can be efficiently formed.

According to the method for forming the thick film pattern described above, for example, even when the content of the powdered inorganic material is high, and hence, when the optical transmission of the photosensitive paste film is low, a thick film pattern can be reliably formed, and a pattern having a rectangular cross-section and superior high-frequency transmission characteristics can be efficiently obtained.

When at least two types of powdered inorganic materials are used, the average particle diameter m of the powdered inorganic material described above means the average particle diameter of a powdered inorganic material having the highest content compared to those of all other inorganic materials.

In addition, a thick film pattern in the method for forming the thick film pattern of the present invention having an approximately rectangular cross-section in the direction perpendicular to the longitudinal direction of the thick film pattern is preferably formed.

The method for forming the thick film pattern of the present invention is a method suitably used for forming a thick film pattern having a high shape accuracy, and hence, a thick film pattern having a rectangular cross-section can be reliably formed. Hence, a thick film pattern having superior adhesiveness to a substrate or the like, superior high-frequency transmission characteristics and a rectangular cross-section can be efficiently formed.

A photosensitive paste according to the present invention is used for forming a thick film pattern having an approximately rectangular cross-section in the direction perpendicular to the longitudinal direction of the thick film pattern, and comprises a powdered inorganic material having an average particle diameter m; wherein the average particle diameter m satisfies the equation, $t \leq d+m$, in which d indicates the photocurable depth of the photosensitive paste, and t is the thickness of a film formed of the photosensitive paste. The photosensitive paste used satisfies this equation, and accordingly, since the entire photosensitive paste film formed by coating is reliably cured in the thickness direction thereof, a thick film pattern having a rectangular cross-section can be reliably formed.

Consequently, a thick film pattern having superior adhesiveness to an object (typically, a substrate) on which the thick film pattern is formed, superior high-frequency transmission characteristics, and a rectangular cross-section can be efficiently formed by using the photosensitive paste of the present invention, and hence, the advantages of the present invention can be fully realized.

DESCRIPTION OF THE PREFERRED EMBODIMENTS

Figure 1:
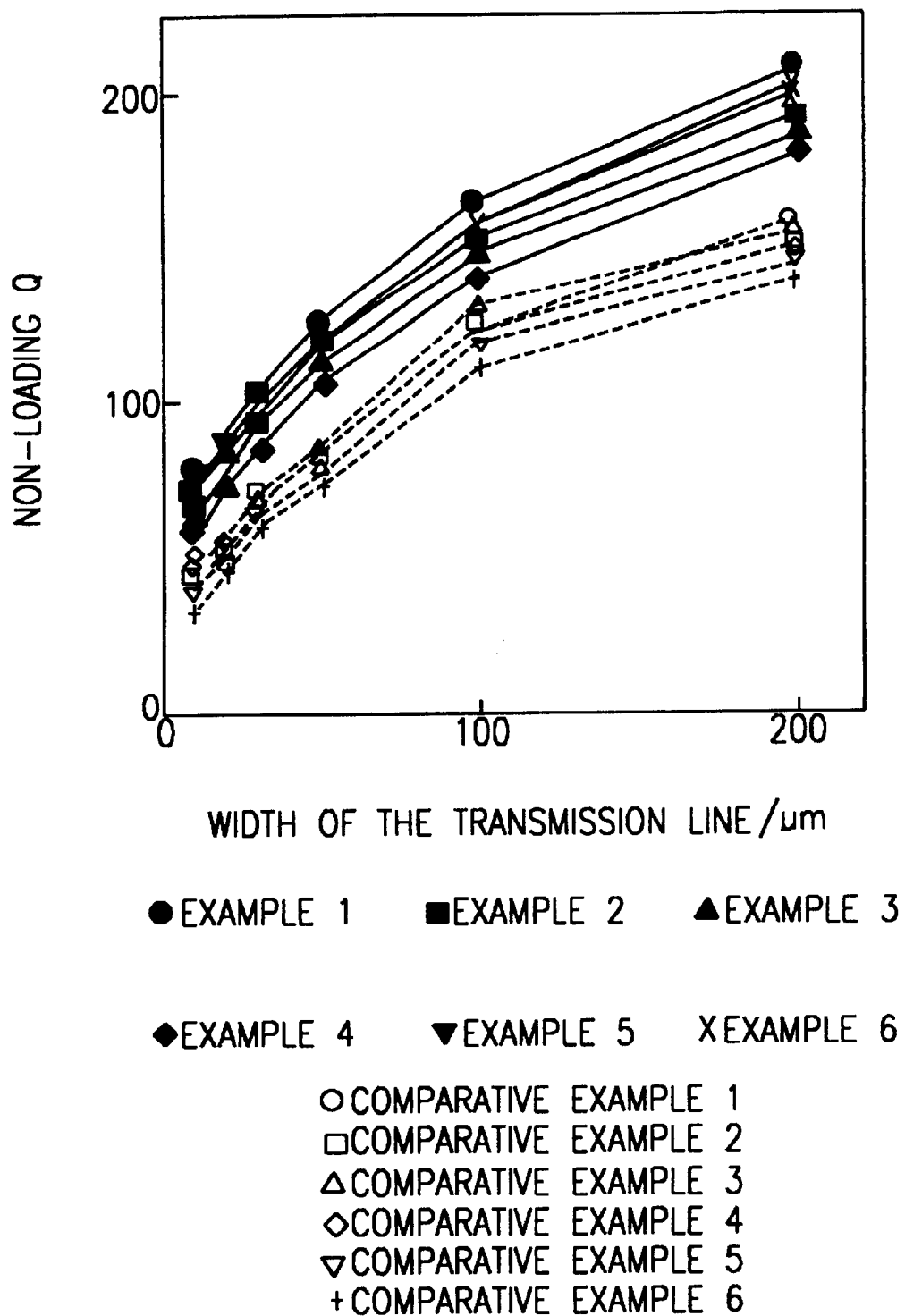
FIG. 1 is a graph showing high-frequency transmission characteristics (non-loading Q at 10 GHz) of transmission lines according to examples and comparative examples.

A method for forming a thick film pattern of the present invention is advantageously used for, for example, forming a film having a fine pattern on a substrate by a photolithographic method.

According to the method for forming a thick film pattern of the present invention, a photosensitive paste film is first formed by applying a photosensitive paste to a substrate or the like by a known film formation method, such as screen printing, spin coating or a doctor blade method, and subsequently, by drying the photosensitive paste applied to the substrate.

Next, the photosensitive paste film is exposed using a mask having a predetermined pattern and is then developed by using a developing solution, such as an aqueous solution containing sodium carbonate, whereby a thick film pattern having a desired pattern can be formed.

When the thick film pattern is fired, a thick film pattern (a thick film conductor) which serves as a conductor (an electrode) is formed on the substrate or the like when the solid in the paste is conductive.

In the method according to the present invention, the photosensitive resin component (a photosensitive organic component) for forming the photosensitive paste is a photopolymerizable compound or a photo-modification compound, and for example, there may be mentioned (1) a mixture of a monomer or an oligomer having reactive functional groups such as unsaturated groups and a photopolymerization initiator such as an aromatic carbonyl compound, (2) a so-called diazo resin such as a condensation product of an aromatic bis-azide and formaldehyde, (3) a mixture of an addition-polymerizable compound such as an epoxy compound and a photo-acid generator such as a diallyliodonium salt and (4) a naphthoquinone diazide compound.

Among these materials described above, the mixture of the monomer having reactive functional groups such as unsaturated groups and the photopolymerization initiator such as an aromatic carbonyl compound (1) is particularly preferable.

As the monomer or the oligomer having reactive groups, for example, there may be mentioned hexanediol triacrylate, tripropylene glycol triacrylate, trimethylolpropane triacrylate, stearyl acrylate, tetrahydrofurfuryl acrylate, lauryl acrylate, 2-phenoxyethyl acrylate, isodecyl acrylate, isooctyl acrylate, tridecyl acrylate, caprolactone acrylate, ethoxylated nonyl phenol acrylate, 1,3-butanediol diacrylate, 1,4-butanediol diacrylate, diethylene glycol diacrylate, tetraethylene glycol diacrylate, triethylene glycol diacrylate, ethoxylated bisphenol A diacrylate, propoxylated neopentyl glycol diacrylate, tris(2-hydroxyethyl) isocyanurate triacrylate, ethoxylated trimethylolpropane triacrylate, pentaerythritol triacrylate, propoxylated trimethylolpropane triacrylate, propoxylated glyceryl triacrylate, pentaerythritol tetraacrylate, ditrimethylolpropane tetraacrylate, dipentaerythritolhydroxy pentaacrylate, ethoxylated pentaerythritol tetraacrylate, tetrahydrofurfuryl methacrylate, cyclohexyl methacrylate, isodecyl methacrylate, lauryl methacrylate, triethylene glycol dimethacrylate, ethylene glycol dimethacrylate, tetraethylene glycol dimethacrylate, 1,4-butanediol dimethacrylate, diethylene glycol dimethacrylate, 1,9-nonanediol diacrylate, 1,6-hexanediol dimethacrylate, neopentyl glycol dimethacrylate, 1,3-butylene glycol dimethacrylate, ethoxylated bisphenol A dimethacrylate, trimethylolpropane trimethacrylate, ethoxylated isocyanuric acid diacrylate, ethoxylated paracumylphenol acrylate, ethylhexyl carbitol acrylate, N-vinyl-2-pyrolidone, isobornyl acrylate, polypropylene glycol diacrylate, polyethylene glycol diacrylate, dipentaerythritol pentaacrylate, and dipentaerythritol hexaacrylate.

As a photopolymerization initiator preferably used in the present invention, for example, there may be mentioned benzil, benzoin ethyl ether, benzoin isobutyl ether, benzoin isopropyl ether, benzophenone, benzoylbenzoic acid, benzoyl methyl benzoate, 4-benzoyl-4'-methyl-diphenyl sulfide, benzyl dimethyl ketal, 2-n-butoxy-4-dimethylaminobenzoate, 2-chlorothioxanthone, 2,4-diethyl thioxanthone, 2,4-diisopropyl thioxanthone, isopropyl thioxanthone, 2-(dimethylamino)ethylbenzoate, p-(dimethylamino)ethylbenzoate, p-(dimethylamino) isoamylbenzoate, 3,3'-dimethyl-4-methoxy-benzophenone, 2,4-dimethyl thioxanthone, 1-(4-dodecylphenyl)-2-hydroxy-2-methyl propane-1-one, 2,2-dimethoxy-1,2-diphenylethane-1-one, hydroxycyclohexyl phenyl ketone, 2-hydroxy-2-methyl-1-phenylpropane-1-one, 1-[4-(2-hydroxyethoxy)-phenyl]-2-hydroxy-2-methyl-1-propane-1-one, 2-methyl-1-[4-(methylthio)phenyl]-2-morpholinopropane-1-one, methylbenzoyl formate, 1-phenyl-1,2-propanedione-2-(o-ethoxycarbonyl)oxime, 2-benzyl-2-dimethylamino-1-(4-morpholinophenyl)-1-butanone, bis(2,6-dimethoxybenzoyl)-2,4,4-trimethylpentylphosphine oxide, bis(2,4,6-trimethylbenzoyl)-phenylphosphine oxide, bis(2,4,6-trimethylbenzoyl)-2,4,4-trimethylpentylphosphine oxide, bis(2,6-dichlorobenzoyl)-2,4,4-trimethylpentylphosphine oxide, 1-(4-isopropylphenyl)-2-hydroxy-2-methylpropane-1-one, 1,2-diphenylethane-dione, and methyl phenyl glyoxylate. In addition, these photopolymerization initiators may be used alone or in combination.

The content of the photopolymerization initiator of the present invention is preferably about 0.1 to 5 wt % with respect to 100 wt % of the photosensitive paste. The reasons for this is that when the content of the photopolymerization initiator is less than about 0.1 wt %, curing is not sufficiently performed by light, and when the content is more than about 5 wt %, an improvement of the curing properties can be hardly observed.

In addition, among photosensitive pastes containing the photosensitive organic components described above, an acrylic copolymer having pendant carboxyl groups is particularly preferable, and this acrylic copolymer can be obtained by copolymerizing an unsaturated carboxylic acid and an ethylenic unsaturated compound.

As the unsaturated carboxylic acid, acrylic acid, methacrylic acid, maleic acid, fumaric acid, or an anhydride thereof, may be mentioned by way of example.

As the ethylenic unsaturated compound, an acrylic ester, such as methyl acrylate or ethyl acrylate; a methacrylic ester, such as methyl methacrylate or ethyl methacrylate; vinyl acetate or a fumaric ester such as monoethyl fumarate may be mentioned by way of example.

In addition, a material having unsaturated bonds formed by oxidating a copolymer formed by copolymerizing the compounds described above may also be used.

When a powdered conductor is used as an inorganic material contained in the photosensitive paste, powdered Ag, powdered Au, powdered Pt, powdered Pd, powdered Cu, powdered Ni, powdered W, powdered Al, powdered Mo and the like may be used alone or in combination. In addition, a powdered alloy containing the metals mentioned above may also be used. In addition, powdered conductors having various shapes, such as a sphere, a plate, a block, a bar or a needle, may be used; however, a powdered conductor which is not agglomerated and which has good dispersibility is preferably used, and the average particle diameter thereof is preferably about 0.05 to 10 $\mu$m. More preferably, the average particle diameter is about 0.5 to 5 $\mu$m.

The reasons for this is that when the average particle diameter of the powdered conductor is less than about 0.05 $\mu$m, the agglomeration force of the particles is large, and hence, a photosensitive conductive paste having a superior dispersibility cannot be obtained, and when the average particle diameter of the powdered conductor is more than about 10 $\mu$m, a fine wiring pattern cannot be obtained.

In the photosensitive paste of the present invention, the content of the powdered conductor is preferably in the range of from about 60 to 90 wt %, and more preferably, in the range of from about 65 to 85 wt %.

The reason for this is that when the content of the powdered conductor is less than about 60 wt %, wire breakage and/or crack generation occur due to the shrinkage during firing, and hence, a desired pattern cannot be obtained. In addition, when the content is more than about 90 wt %, since the amount of the photosensitive resin component is deficient, and as a result, sufficient curing cannot be performed.

In addition, when a powdered insulator is used as the powdered inorganic material, a powdered glass and/or a powdered ceramic can be advantageously used. As the powdered glass, a known powdered glass such as a powdered borosilicate glass may be used, and as the powdered ceramic, a known powdered ceramic, such as a crystallized glass, a glass-ceramic composite or a non-glass ceramic, may be used.

More particularly, a powdered glass such as $SiO_2$—PbO, $SiO_2$—ZnO, $SiO_2$—$Bi_2O_3$, $SiO_2$—$K_2O$, $SiO_2$—$Na_2O$, $SiO_2$—PbO—$B_2O_3$, $SiO_2$—ZnO—$B_2O_3$, $SiO_2$—$Bi_2O_3$—$B_2O_3$, $SiO_2$—$K_2O$—$B_2O_3$ or $SiO_2$—$Na_2O$—$B_2O_3$, may be used.

As the powdered ceramic, for example, an oxide, a boron compound, a nitride or a silicon compound containing at least one metal selected from the group consisting of Al, Ag, Cu, Ni, Ti, Ba, Pb, Zr, Mn, Cr, Sr, Fe, Y, Nb, La, Si, Zn and Ru may be used.

As is the case of the powdered conductor described above, powdered insulators having various shapes, such as a sphere, a plate, a block, a bar or a needle, may be used; however, a powdered insulator which is not agglomerated and has good dispersibility is preferably used, and hence, a powdered insulator having an average particle diameter of about 0.1 to 10 $\mu$m is preferably used.

In the case in which the photosensitive paste contains the powdered glass described above is used for forming an insulator, the content of the powdered glass is preferably in the range of from about 40 to 80 wt %. The reason for this is that when the content of the powdered glass is less than about 40 wt %, insulation defects are likely to occur due to the degradation of the insulating properties of the insulator film after firing, and when the content is more than about 80 wt %, it is difficult to obtain a fine pattern due to light scattering caused by the powdered glass.

When the photosensitive paste contains the powdered glass described above is used as a paste for forming a conductor, and in addition, when a powdered insulator is further added to the photosensitive conductive paste described above, the content of the powdered insulator is preferably in the range of from about 0.1 to 10 wt %. The reason for this is that when the content of the powdered insulator is less than about 0.1 wt %, it is difficult to obtain a preferable pattern due to insufficient adhesiveness to the substrate, and when the content is more than about 10 wt %, the conductivity and the solderability of the pattern formed by firing are degraded.

Furthermore, the photocurable depth of a photosensitive paste film can be changed by adjusting the composition of the photosensitive paste. The thickness of the photosensitive paste film is preferably equivalent to or less than that of the photocurable depth.

In particular, the photosensitive paste film is preferably formed so that $t \leq d+m$ is satisfied, in which t indicates the thickness of the photosensitive paste film, d indicates the photocurable depth, and m indicates the average particle diameter of the powdered inorganic material. When the equation described above is satisfied, a photosensitive paste film having a rectangular cross-section after development and a thick film pattern having a rectangular cross-section after firing can be reliably obtained.

EXAMPLES

Hereinafter, examples of the present invention and comparative examples will be described, and in addition, the features thereof will also be described in detail.

In these examples and comparative examples, as a powdered inorganic material, a powdered Ag metal, powdered Ag—Pt alloy, a powdered Cu metal, a powdered $SiO_2$—$B_2O_3$—$Bi_2O_3$ glass, a powdered $SiO_2$—PbO—$B_2O_3$ glass or powdered $Al_2O_3$ (alumina) having a predetermined average particle diameter was used.

In addition, in these examples and comparative examples, as an acrylic copolymer constituting a photosensitive resin component, a methyl methacrylate—methacrylic acid copolymer was used; as a photopolymerizable monomer, ethoxylated trimethylolpropane triacrylate was used; as a photopolymerization initiator, 2-methyl-1-[4-(methylthio) phenyl]-2-morpholinopropane-1-one, 2,4-diethyl thioxanthone, and 2-benzyl-2-dimethylamino-1-(4-morpholinophenyl)-1-butanone were used.

Formation of Photosensitive Pastes A to H

The powdered inorganic material, the acrylic copolymer, the photopolymerizable monomer and the photopolymerization initiator were mixed with an organic solvent in accordance with the composition ratios as shown below, and the mixtures thus formed were kneaded by using a three-roll mill, whereby photosensitive pastes A to H were prepared.

The photocurable depths and the compositions of the individual photosensitive pastes are shown below.

| Photosensitive Paste A (photocurable depth of 7.8 μm) | |
|---|---|
| Powdered Ag | 75.0 wt % |
| (average particle diameter of 3.0 μm) | |
| Methyl methacrylate-methacrylic acid copolymer | 4.5 wt % |
| Ethoxylated trimethylolpropane triacrylate | 5.2 wt % |
| 2-methyl-1-[4-(methylthio)phenyl]-2-morpholinopropane-1-one | 1.0 wt % |
| 2,4-diethyl thioxanthone | 0.26 wt % |
| 2-benzyl-2-dimethylamino-1-(4-morpholinophenyl)-1-butanone | 0.14 wt % |
| Ethyl carbitol acetate | 13.9 wt % |
| Photosensitive Paste B (photocurable depth of 9.0 μm) | |
| Powdered Ag | 70.0 wt % |
| (average particle diameter of 3.0 μm) | |
| Powdered $SiO_2$—$B_2O_3$—$Bi_2O_3$ glass | 3.0 wt % |
| (average particle diameter of 3.0 μm) | |
| Methyl methacrylate-methacrylic acid copolymer | 6.0 wt % |
| Ethoxylated trimethylolpropane triacrylate | 5.8 wt % |
| 2-methyl-1-[4-(methylthio)phenyl]-2-morpholinopropane-1-one | 0.6 wt % |
| 2,4-diethyl thioxanthone | 0.2 wt % |
| 2-benzyl-2-dimethylamino-1-(4-morpholinophenyl)-1-butanone | 0.8 wt % |
| Ethyl carbitol acetate | 13.6 wt % |
| Photosensitive Paste C (photocurable depth of 7.3 μm) | |
| Powdered Ag | 71.1 wt % |
| (average particle diameter of 1.8 μm) | |
| Powdered $SiO_2$—$B_2O_3$—$Bi_2O_3$ glass | 1.9 wt % |
| (average particle diameter of 3.0 μm) | |
| Methyl methacrylate-methacrylic acid copolymer | 6.0 wt % |
| Ethoxylated trimethylolpropane triacrylate | 5.8 wt % |
| 2-methyl-1-[4-(methylthio)phenyl]-2-morpholinopropane-1-one | 0.6 wt % |
| 2,4-diethyl thioxanthone | 0.2 wt % |
| 2-benzyl-2-dimethylamino-1-(4-morpholinophenyl)-1-butanone | 0.8 wt % |
| Ethyl carbitol acetate | 13.6 wt % |
| Photosensitive Paste D (photocurable depth of 2.5 μm) | |
| Powdered Ag | 71.1 wt % |
| (average particle diameter of 0.6 μm) | |
| Powdered $SiO_2$—$B_2O_3$—$Bi_2O_3$ glass | 1.9 wt % |
| (average particle diameter of 3.0 μm) | |
| Methyl methacrylate-methacrylic acid copolymer | 6.0 wt % |
| Ethoxylated trimethylolpropane triacrylate | 5.8 wt % |
| 2-methyl-1-[4-(methylthio)phenyl]-2-morpholinopropane-1-one | 0.6 wt % |
| 2,4-diethyl thioxanthone | 0.2 wt % |
| 2-benzyl-2-dimethylamino-1-(4-morpholinophenyl)-1-butanone | 0.8 wt % |
| Ethyl carbitol acetate | 13.6 wt % |
| Photosensitive Paste E (photocurable depth of 10.3 μm) | |
| Powdered Ag-Pt | 63.0 wt % |
| (average particle diameter of 2.2 μm) | |
| Powdered $SiO_2$—$B_2O_3$—$Bi_2O_3$ glass | 2.0 wt % |
| (average particle diameter of 3.0 μm) | |
| Methyl methacrylate-methacrylic acid copolymer | 6.3 wt % |
| Ethoxylated trimethylolpropane triacrylate | 7.2 wt % |
| 2-methyl-1-[4-(methylthio)phenyl]-2-morpholinopropane-1-one | 1.3 wt % |
| 2,4-diethyl thioxanthone | 0.33 wt % |
| 2-benzyl-2-dimethylamino-1-(4-morpholinophenyl)-1-butanone | 0.41 wt % |
| Ethyl carbitol acetate | 19.46 wt % |
| Photosensitive Paste F (photocurable depth of 4.5 μm) | |
| Powdered Cu | 80.0 wt % |
| (average particle diameter of 3.0 μm) | |

| -continued | |
|---|---|
| Methyl methacrylate-methacrylic acid copolymer | 5.1 wt % |
| Ethoxylated trimethylolpropane triacrylate | 4.9 wt % |
| 2-methyl-1-[4-(methylthio)phenyl]-2-morpholinopropane-1-one | 0.5 wt % |
| 2,4-diethyl thioxanthone | 0.2 wt % |
| 2-benzyl-2-dimethylamino-1-(4-morpholinophenyl)-1-butanone | 0.7 wt % |
| Propylene glycol monomethyl ether acetate | 8.6 wt % |
| Photosensitive Paste G (photocurable depth of 40.5 μm) | |
| Powdered $Al_2O_3$ | 80.0 wt % |
| (average particle diameter of 2.5 μm) | |
| Methyl methacrylate-methacrylic acid copolymer | 5.3 wt % |
| Ethoxylated trimethylolpropane triacrylate | 4.7 wt % |
| 2-methyl-1-[4-(methylthio)phenyl]-2-morpholinopropane-1-one | 0.6 wt % |
| 2,4-diethyl thioxanthone | 0.2 wt % |
| 2-benzyl-2-dimethylamino-1-(4-morpholinophenyl)-1-butanone | 0.8 wt % |
| Ethyl carbitol acetate | 8.4 wt % |
| Photosensitive Paste H (photocurable depth of 39.8 μm) | |
| Powdered $SiO_2$—PbO—$B_2O_3$ glass | 65.0 wt % |
| (average particle diameter of 3.0 μm) | |
| Methyl methacrylate-methacrylic acid copolymer | 6.3 wt % |
| Ethoxylated trimethylolpropane triacrylate | 7.2 wt % |
| 2-methyl-1-[4-(methylthio)phenyl]-2-morpholinopropane-1-one | 0.25 wt % |
| 2,4-diethyl thioxanthone | 0.06 wt % |
| 2-benzyl-2-dimethylamino-1-(4-morpholinophenyl)-1-butanone | 1.73 wt % |
| Ethyl carbitol acetate | 10.86 wt % |
| Propylene glycol monomethyl ether acetate | 8.6 wt % |

Formation of Samples for Examples 1 to 8

By using the photosensitive pastes A to H, samples for examples 1 to 8 and samples for comparative examples 1 to 8 were formed.

Example 1

By using the photosensitive paste A having a photocurable depth of 7.8 μm, a photosensitive paste film 7.6 μm thick was formed by screen printing on an alumina substrate. Subsequently, by radiating light beams of an ultra high-pressure mercury lamp having an energy density of 2,000 mJ/cm$^2$, an exposure treatment was performed on the photosensitive paste film through a photomask, and development was then performed by using an aqueous solution containing sodium carbonate at a concentration of 0.5 wt %.

For the patterned films thus formed, the occurrence of peeling after the development and the cross-section after development and firing were evaluated using a microscope. In addition, using the photosensitive paste A, a photosensitive paste film 7.6 μm thick was formed on a dielectric substrate, and a microstrip resonator was then formed by exposure using a photomask, development and firing. Subsequently, the transmission characteristics of the microstrip resonator thus formed at a high frequency of 10 GHz were evaluated using a network analyzer. In this evaluation, non-loading Q was used as an index of the transmission characteristics.

Example 2

By using the photosensitive paste B having a photocurable depth of 9.0 μm, a photosensitive paste film 12.0 μm thick was formed by screen printing on an alumina substrate. Subsequently, by radiating light beams from an ultra high-pressure mercury lamp having an energy density of 2,000 mJ/cm$^2$, an exposure treatment was performed on the photosensitive paste film using a photomask, and development was then performed by using an aqueous solution containing sodium carbonate at a concentration of 0.5 wt %.

For the patterned films thus formed, the occurrence of peeling after the development and the cross-section after development and firing were evaluated using a microscope. In addition, using the photosensitive paste B, a photosensitive paste film 12.0 μm thick was formed on a dielectric substrate, and a microstrip resonator was then formed by exposure using a photomask, development and firing.

Subsequently, the transmission characteristics of the microstrip resonator thus formed at a high frequency of 10 GHz were evaluated using a network analyzer. In this evaluation, non-loading Q was used as an index of the transmission characteristics.

Example 3

Using the photosensitive paste C having a photocurable depth of 7.3 μm, a photosensitive paste film 8.5 μm thick was formed by screen printing on an alumina substrate. Subsequently, by radiating light beams from an ultra high-pressure mercury lamp having an energy density of 2,000 mJ/cm$^2$, an exposure treatment was performed on the photosensitive paste film using a photomask, and development was then performed by using an aqueous solution containing sodium carbonate at a concentration of 0.5 wt %.

The occurrence of peeling after the development and the cross-section after development and firing of the patterned films thus formed were evaluated using a microscope. In addition, using the photosensitive paste C, a photosensitive paste film 8.5 μm thick was formed on a dielectric substrate, and a microstrip resonator was then formed by exposure using a photomask, development and firing. Using the microstrip resonator thus formed, transmission characteristics at a high frequency of 10 GHz were evaluated using a network analyzer. In this evaluation, non-loading Q was used as an index of the transmission characteristics.

Example 4

By using the photosensitive paste D having a photocurable depth of 2.5 μm, a photosensitive paste film 3.0 μm thick was formed by screen printing on an alumina substrate. Subsequently, by radiating through a photomask light beams from an ultra high-pressure mercury lamp having an energy density of 2,000 mJ/cm$^2$, an exposure treatment was performed on the photosensitive paste film and development was then performed by using an aqueous solution containing sodium carbonate at a concentration of 0.5 wt %.

The occurrence of peeling in the patterned films thus formed after the development and the cross-section after the development and firing were evaluated using a microscope. In addition, using the photosensitive paste D, a photosensitive paste film 3.0 μm thick was formed on a dielectric substrate, and a microstrip resonator was then formed by exposure using a photomask, development and firing. Subsequently, the transmission characteristics of the microstrip resonator thus formed at a high frequency of 10 GHz were evaluated using a network analyzer. As an index of the transmission characteristics, non-loading Q was used in this evaluation.

Example 5

With the photosensitive paste E having a photocurable depth of 10.3 μm, a photosensitive paste film 12.2 μm thick was formed by screen printing on an alumina substrate. Subsequently, by radiating light beams from an ultra high-pressure mercury lamp having an energy density of 2,000 mJ/cm$^2$, an exposure treatment was performed on the photosensitive paste film using a photomask, and development was then performed by using an aqueous solution containing sodium carbonate at a concentration of 0.5 wt %.

For the patterned films thus formed, the occurrence of peeling after development and the cross-section after development and firing were evaluated using a microscope. In addition, a photosensitive paste film 12.2 μm thick using the photosensitive past E was formed on a dielectric substrate, and a microstrip resonator was then formed by exposure using a photomask, development and firing. Using the microstrip resonator thus formed, transmission characteristics at a high frequency of 10 GHz were evaluated using a network analyzer. Also in this evaluation, as an index of the transmission characteristics, non-loading Q was used.

Example 6

By using the photosensitive paste F having a photocurable depth of 4.5 μm, a photosensitive paste film 6.5 μm thick was formed by screen printing on an alumina substrate. By radiating light beams from an ultra high-pressure mercury lamp having an energy density of 2,000 mJ/cm$^2$, an exposure treatment was performed on the photosensitive paste film using a photomask, and development was then performed by using an aqueous solution containing sodium carbonate at a concentration of 0.5 wt %.

The occurrence of peeling after the development of the patterned films thus formed and the cross-section after development and firing were evaluated using a microscope. Using the photosensitive paste F, a photosensitive paste film 6.5 μm thick was formed on a dielectric substrate, and a microstrip resonator was then formed by exposure using a photomask, development and firing. Subsequently, transmission characteristics of the microstrip resonator thus formed at a high frequency of 10 GHz were evaluated using a network analyzer. Non-loading Q was used in this evaluation as an index of the transmission characteristics.

Example 7

By using the photosensitive paste G having a photocurable depth of 40.5 μm, a photosensitive paste film 35.0 μm thick was formed by screen printing on an alumina substrate. Subsequently, an exposure treatment was performed on the photosensitive paste film by radiating light beams from an ultra high-pressure mercury lamp having an energy density of 2,000 mJ/cm$^2$, using a photomask, and development was then performed by using an aqueous solution containing sodium carbonate at a concentration of 0.5 wt %.

For the patterned films thus formed, the occurrence of peeling after the development and the cross-section after the development and firing were evaluated using a microscope.

Example 8

By using the photosensitive paste H having a photocurable depth of 39.8 μm, a photosensitive paste film 36.5 μm thick was formed by screen printing on an alumina substrate. Subsequently, by radiating light beams from an ultra high-pressure mercury lamp having an energy density of 2,000 mJ/cm$^2$, an exposure treatment was performed on the photosensitive paste film using a photomask, and development was then performed by using an aqueous solution containing sodium carbonate at a concentration of 0.5 wt %.

For the patterned films thus formed, the occurrence of peeling after the development and the cross-section after the development and firing were evaluated using a microscope.

The properties of the samples of Examples 1 to 8 measured as described above are shown in Table 1.

The thickness of the photosensitive paste film of Comparative Example 2: 12.1 μm.

The other conditions were equivalent to those for Example 2.

TABLE 1

|  | Example 1 | Example 2 | Example 3 | Example 4 | Example 5 | Example 6 | Example 7 | Example 8 |
|---|---|---|---|---|---|---|---|---|
| Photosensitive Paste | A | B | C | D | E | F | G | H |
| Powdered Conductor | Ag | Ag | Ag | Ag | Ag-Pt | Cu | None | None |
| Content of Powdered Conductor (%) | 75 | 70 | 71.1 | 71.1 | 63 | 80 | 0 | 0 |
| Average Particle Diameter of Powdered Conductor (μm) | 3.0 | 3.0 | 1.8 | 0.6 | 2.2 | 3.0 | — | — |
| Powdered Insulator | None | Glass | Glass | Glass | Glass | None | Alumina | Glass |
| Content of Powdered Insulator (%) | 0 | 3.0 | 1.9 | 1.9 | 2 | 0 | 80 | 65 |
| Average Particle Diameter of Powdered Insulator (μm) | — | 3.0 | 3.0 | 3.0 | 3.0 | — | 2.5 | 3.0 |
| Photocurable Depth (d) (μm) | 7.8 | 9.0 | 7.3 | 2.5 | 10.3 | 4.5 | 40.5 | 39.8 |
| d + m (μm) | 10.8 | 12.0 | 9.1 | 3.1 | 12.2 | 7.5 | 43.0 | 42.8 |
| Thickness of Photosensitive Paste Film (t) (μm) | 7.6 | 12.0 | 8.5 | 3.0 | 12.2 | 6.5 | 35.0 | 36.5 |
| Peeling | None | None | None | None | None | None | None | None |
| Cross-Section After Development | Rectangle | Rectangle | Rectangle | Rectangle | Rectangle | Rectangle | Rectangle | Rectangle |
| Cross-Section After Firing | Rectangle | Rectangle | Rectangle | Rectangle | Rectangle | Rectangle | Rectangle | Rectangle |

As shown in Table 1, the occurrence of peeling of the photosensitive paste film after the development in the individual samples of Examples 1 to 8 was not observed. In addition, the cross-section of each photosensitive paste film after the development was rectangular, and the cross-section of each thick film pattern (electrode conductor) after the firing was also rectangular.

As can be seen from the results shown in the table above, it was understood that a thick film pattern to which a current is not concentrated and which has a rectangular cross-section and superior transmission characteristics at a high frequency could be reliably formed according to the present invention.

Formation of Samples for Comparative Examples 1 to 8

For comparison, samples (samples for Comparative Examples 1 to 8) were formed in a manner equivalent to that for the Examples 1 to 8 except that the thickness of the photosensitive paste film was changed (that is, the thickness of the photosensitive paste film is larger than the photocurable depth), and the properties thereof were measured.

The relationships of the thicknesses of the photosensitive paste films of Comparative Examples 1 to 8 with those of Examples 1 to 8 were shown below.

Comparative Example 1

The thickness of the photosensitive paste film of Example 1: 7.6 μm.

The thickness of the photosensitive paste film of Comparative Example 1: 10.9 μm.

The other conditions were equivalent to those for Example 1.

Comparative Example 2

The thickness of the photosensitive paste film of Example 2: 12.0 μm.

Comparative Example 3

The thickness of the photosensitive paste film of Example 3: 8.5 μm.

The thickness of the photosensitive paste film of Comparative Example 3: 10.8 μm.

The other conditions were equivalent to those for Example 3.

Comparative Example 4

The thickness of the photosensitive paste film of Example 4: 3.0 μm.

The thickness of the photosensitive paste film of Comparative Example 4: 7.5 μm.

The other conditions were equivalent to those for Example 4.

Comparative Example 5

The thickness of the photosensitive paste film of Example 5: 12.2 μm.

The thickness of the photosensitive paste film of Comparative Example 5: 12.3 μm.

The other conditions were equivalent to those for Example 5.

Comparative Example 6

The thickness of the photosensitive paste film of Example 6: 6.5 μm.

The thickness of the photosensitive paste film of Comparative Example 6: 8.8 μm.

The other conditions were equivalent to those for Example 6.

Comparative Example 7

The thickness of the photosensitive paste film of Example 7: 35.0 μm.

The thickness of the photosensitive paste film of Comparative Example 7: 48.3 μm.

The other conditions were equivalent to those for Example 7.

Comparative Example 8

The thickness of the photosensitive paste film of Example 8: 36.5 μm.

The thickness of the photosensitive paste film of Comparative Example 8: 51.4 μm.

The properties of the samples of Comparative Examples 1 to 8 measured in the manner described above are shown in Table 2.

the development was not serious. Furthermore, the inversed trapezoidial cross-section shape of the thick film pattern formed after the firing and the edge-curl phenomenon were also not so serious.

Accordingly, when a thick film pattern having a rectangular cross-section and a high shape accuracy is formed, the thickness t of the photosensitive paste film is preferably not more than the sum of the photocurable depth d and the average particle diameter m of the powdered inorganic material. However, when the thick film pattern to be formed is not required to have a high shape accuracy, as were the samples of Comparative Examples 2 and 5, the thickness of the photosensitive paste film may be determined to be larger to some degree than that of the sum of the photocurable

TABLE 2

|  | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|
| Photosensitive Paste | A | B | C | D | E | F | G | H |
| Powdered Conductor | Ag | Ag | Ag | Ag | Ag-Pt | Cu | None | None |
| Content of Powdered Conductor (%) | 75 | 70 | 71.1 | 71.1 | 63 | 80 | 0 | 0 |
| Average Particle Diameter of Powdered Conductor (μm) | 3.0 | 3.0 | 1.8 | 0.6 | 2.2 | 3.0 | — | — |
| Powdered Insulator | None | Glass | Glass | Glass | Glass | None | Alumina | Glass |
| Content of Powdered Insulator (%) | 0 | 3.0 | 1.9 | 1.9 | 2 | 0 | 80 | 65 |
| Average Particle Diameter of Powdered Insulator (μm) | — | 3.0 | 3.0 | 3.0 | 3.0 | — | 2.5 | 3.0 |
| Photocurable Depth (d) (μm) | 7.8 | 9.0 | 7.3 | 2.5 | 10.3 | 4.5 | 40.5 | 39.8 |
| d + m (μm) | 10.8 | 12.0 | 9.1 | 3.1 | 12.2 | 7.5 | 43.0 | 42.8 |
| Thickness of Photosensitive Paste Film (t) (μm) | 10.9 | 12.1 | 10.8 | 7.5 | 12.3 | 8.8 | 48.3 | 51.4 |
| Peeling | None | Partly Present (Slightly) | Partly Present | Partly Present | None | Partly Present | Partly Present | Partly Present |
| Cross-Section after Development | Inversed Trapezoid (Slight) | Inversed Trapezoid (Slight) | Inversed Trapezoid | Inversed Trapezoid | Inversed Trapezoid (Slight) | Inversed Trapezoid | Inversed Trapezoid | Inversed Trapezoid |
| Cross-Section After Firing | Inversed Trapezoid (Slight) | Edge Curl (Slight) | Edge Curl | Edge Curl | Inversed Trapezoid (Slight) | Edge Curl | Inversed Trapezoid | Inversed Trapezoid |

Since the thickness t of the photosensitive paste film was considerably larger in Comparative Examples 3, 4, 6, 7 and 8 than the photocurable depth d and than the sum of the photocurable depth d and the average particle diameter m of the powdered inorganic material, the occurrence of peeling of the photosensitive paste film was observed after development, or a photosensitive paste film having a cross-section in an inversed trapezoidial shape was formed after development. In addition, a thick film pattern (transmission line) having a cross-section in an inversed trapezoidial shape was formed after firing, and/or an edge-curl phenomenon was observed, whereby a thick film pattern having superior transmission characteristics at a high frequency could not be formed.

Since the thickness t of the photosensitive paste film in Comparative Examples 1, 2 and 5, was slightly larger than the sum of the photocurable depth d and the average particle diameter m of the powdered inorganic material, the occurrence of peeling of the photosensitive paste film was not observed after the development, and even when it was observed, the degree of the occurrence of peeling was not significant. In addition, the inversed trapezoidial cross-section shape of the photosensitive paste film formed after depth d and the average particle diameter m of the powdered inorganic material.

High-frequency Transmission Characteristics

The high-frequency transmission characteristics (non-loading Q at 10 GHz) of transmission lines of Examples 1 to 6 and Comparative Examples 1 to 6 are shown in FIG. 1. Since the non-loading Q's width of the transmission lines of Examples 1 to 6 were larger than those of Comparative Examples 1 to 6, it is understood that the high-frequency characteristics of Examples 1 to 6 were superior to those of Comparative Examples 1 to 6.

The present invention is not limited to the embodiments and the examples described above, and within the scope of the present invention, various modifications and various changes may be performed.

As has thus been described, since the method for forming the thick pattern film comprises the steps of measuring the photocurable depth d of the photosensitive paste film beforehand, and determining the thickness t thereof in consideration of the photocurable depth d, a thick film pattern having a desired cross-section can be efficiently formed, and in addition, a thick film pattern having superior adhesiveness to an object (typically, a substrate) on which the thick film pattern is formed and having a high shape accuracy can be efficiently formed.

In addition, when the photosensitive paste is applied to a substrate or the like so that the equation $t \leq d$ is satisfied, that is, when the thickness t of the photosensitive paste film is formed so as to be equivalent to or less than the photocurable depth d, the entire photosensitive paste film in the thickness direction thereof can be reliably cured so as not to be dissolved during development. Accordingly, a thick film pattern having a desired cross-section can be reliably formed, and a thick film pattern having superior adhesiveness to an object (typically, a substrate) on which the thick film pattern is formed and having a rectangular cross-section can be efficiently formed.

Since the thick film pattern described above retains the rectangular cross-section when fired, and hence, edge curl which occurs when a thick film pattern having a cross-section in an inversed trapezoidial shape is fired does not occur, formation of pointed portions on the electrode surface at which a current is concentrated is avoided, and current concentration can be suppressed, whereby the transmission characteristics of the thick film pattern at a high frequency can be improved.

When the average particle diameter of the powdered inorganic material contained in the photosensitive paste is represented by m, and the thickness t of the photosensitive paste film satisfies the equation $t \leq d+m$, the entire photosensitive paste film in the thickness direction thereof can be more reliably cured. Accordingly, a thick film pattern having a desired cross-section can be reliably formed, and a thick film pattern having superior adhesiveness to an object (typically, a substrate) on which the thick film pattern is formed and having superior shape-accuracy can be efficiently formed.

The method for forming the thick film pattern of the present invention is suitable for forming a thick film pattern having a high shape accuracy, and hence, a thick film pattern having a rectangular cross-section can be reliably formed. Accordingly, a thick film pattern having superior adhesiveness to an object (typically, a substrate) on which the thick film pattern is formed, superior high-frequency transmission characteristics and a rectangular cross-section can be efficiently formed, and hence, the advantages of the present invention can be fully realized.

In addition, since the photosensitive paste of the present invention is used so that the equation $t \leq d+m$ is satisfied in which d indicates the photocurable depth, t indicates the thickness of the photosensitive paste film, and m indicates the average particle diameter of the powdered inorganic material, and since the entire photosensitive paste film formed by coating can be reliably cured in the thickness direction thereof, a thick film pattern having a rectangular cross-section can be reliably formed.

Consequently, by using the photosensitive paste of the present invention, a thick film pattern having superior adhesiveness to an object (typically, a substrate) on which the thick film pattern is formed, superior high-frequency transmission characteristics, and a rectangular cross-section can be efficiently formed.

What is claimed is:

1. A method for forming a thick film pattern, comprising providing a photosensitive paste comprising at least one powdered inorganic material and in which the inorganic material present in the largest concentration has an average particle diameter m, and the paste having a photocurable depth d;
coating the photosensitive paste on a substrate to a thickness t in consideration of the photocurable depth d so as to form a photosensitive paste film such that $\leq d+m$;
exposing at least a portion of the photosensitive paste film; and
developing the exposed photosensitive paste film so as to form a thick film pattern having a predetermined shape.

2. A method for forming a thick firm pattern according to claim 1, wherein the coating with the photosensitive paste is performed to a thickness t which is about equal to or less than said photocurable depth d of the photosensitive paste.

3. A method for forming a thick film pattern according to claim 2, wherein the coating with the photosensitive paste is performed to a thickness t which is equal to or less than said photocurable depth d of the photosensitive paste.

4. A method for forming a thick film pattern according to claim 3, wherein the powdered inorganic material is a conductor having an m of about 0.05 to 10 μm and constitutes about 60 to 90% of the paste.

5. A method for forming a thick film pattern according to claim 4, wherein the m is about 0.5 to 5 μm and the conductor is about 65 to 85% of the paste.

6. A method for forming a thick film pattern according to claim 3, wherein the powdered inorganic material is an insulator having an m of about 0.1 to 10 μm and constitutes about 40 to 80% of the paste.

7. A method for forming a thick film pattern according to claim 3, wherein the powdered inorganic material is a mixture of a conductor and an insulator.

8. A method for forming a thick film pattern according to claim 3, wherein the photocurable component of the paste comprises an (meth)acrylic copolymer having pendant carboxyl groups.

9. A method for forming a thick film pattern according to claim 8, wherein the powdered inorganic material is a conductor having an m of about 0.05 to 10 μm and constitutes about 60 to 90% of the paste.

10. A substrate having a cured thick film photosensitive paste pattern thereon, wherein the photosensitive paste comprises at least one inorganic substance and in which the inorganic material having the largest concentration has an average particle diameter m and the paste has a photocured depth d and the pattern has a thickness t which is about equal to or less than said photocured depth d of the photosensitive paste plus the diameter m.

11. A substrate according to claim 10, wherein the thickness t is equal to or less than said photocured depth d of the photosensitive paste.

12. A substrate according to claim 11, wherein the photosensitive paste comprises at least one powdered inorganic material, wherein the inorganic material present in the largest concentration has an average particle diameter m, and the photosensitive paste has a thickness $t \leq d+m$.

13. A substrate according to claim 10, wherein the photosensitive paste thickness t is less than or equal to d+m.

14. A substrate according to claim 13, wherein the powdered inorganic material is a conductor having an m of about 0.05 to 10 μm and constitutes about 60 to 90% of the paste.

15. A substrate according to claim 13, wherein the powdered inorganic material is an insulator having an m of about 0.1 to 10 μm and constitutes about 40 to 80% of the paste.

16. A substrate according to claim 13, wherein the powdered inorganic material is a mixture of a conductor and an insulator.

17. A substrate according to claim 13, wherein the paste comprises a photocured (meth)acrylic copolymer having pendant carboxyl groups.

18. A substrate according to claim 17, wherein the powdered inorganic material is a conductor having an m of about 0.05 to 10 μm and constitutes about 60 to 90% of the paste.

* * * * *